| [19] United States Patent
Gardner, Jr.

[11] 4,363,109
[45] Dec. 7, 1982

[54] CAPACITANCE COUPLED EEPROM

[75] Inventor: Raymond K. Gardner, Jr., Kokomo, Ind.

[73] Assignee: General Motors Corporation, Detroit, Mich.

[21] Appl. No.: 211,109

[22] Filed: Nov. 28, 1980

[51] Int. Cl.³ .............................................. G11C 11/40
[52] U.S. Cl. .................................... 365/94; 365/185; 365/218; 357/23
[58] Field of Search ................. 365/94, 103, 104, 174, 365/185, 189, 218; 357/23

[56] References Cited

U.S. PATENT DOCUMENTS

| 3,475,234 | 10/1969 | Kerwin et al. | 365/174 |
| 3,500,142 | 3/1970 | Kahng | 365/185 |
| 3,751,722 | 8/1973 | Richman | 365/174 |
| 3,755,721 | 8/1973 | Frohman-Bentchowsky | 365/185 |
| 3,825,946 | 7/1974 | Frohman-Bentchowsky | 357/23 |
| 3,836,992 | 9/1974 | Abbas et al. | 357/23 |
| 3,881,180 | 4/1975 | Gosney, Jr. | 357/23 |
| 3,906,296 | 9/1975 | Maserjian et al. | 357/7 |
| 4,112,509 | 9/1978 | Wall | 365/185 |

OTHER PUBLICATIONS

*Applied Physics Letters* Oct, 1977 "A New Approach for the Floating-Gate MOS Nonvolatile Memory", H. S. Lee, v. 31 pp. 475-476.
*Proceedings of the IEEE* Jul. 1976, "Nonvolatile Semiconductor Memory Devices" J. J. Chany vol. 64 No. 7 pp. 1039-1059.

Primary Examiner—Terrell W. Fears
Attorney, Agent, or Firm—Robert J. Wallace

[57] ABSTRACT

An electrically programmable and erasable IGFET nonvolatile memory unit, and method for writing/erasing information in it. The IGFET memory unit has two pairs of floating and control gates, with one pair dispersed over the IGFET channel and the other pair disposed over an adjacent memory control region. Applying a voltage to the IGFET control gate and the memory control region, while maintaining the IGFET source and other control gate at zero potential charges the floating gates. Reducing the memory control region to zero potential removes that charge.

6 Claims, 3 Drawing Figures

CAPACITANCE COUPLED EEPROM

FIELD OF THE INVENTION

This invention relates to an electrically erasable programmable nonvolatile memory of the semiconductive type. It more particularly relates to a memory matrix formed of insulated gate field effect transistor (IGFET) memory units, having a floating gate.

BACKGROUND OF THE INVENTION

U.S. patent application Ser. No. 915,390, filed 14 June 1978 in the name of H. S. Lee, and now abandoned, discloses making an electrically reprogrammable semiconductor memory of insulated gate field effect transistors (IGFETs) having polycrystalline silicon floating and control gates. In such transistors, the floating gate is insulatingly sandwiched between the control gate and the surface of the transistor channel region. The floating gate is charged and discharged by applying an apprpriate electrical bias between the control gate overlying the sandwiched gate and the channel region. The sandwiched floating gate has no low resistance electrical connection to it. Hence, it electrically and physically floats above the IGFET channel region. No continued application of electrical power is required to maintain charge on the floating gate. Accordingly, the charge is considered to be nonvolatile.

Floating gates have been negatively charged by avalanche injection and discharged by ultraviolet or x-ray irradiation or by complex capacitance effects. It also is known to discharge them by control gate-channel electrical bias. Avalanche injection charging of the floating gate can be done at a reasonably low potential of 20–40 volts only if the oxide thickness below the floating gate is less than about 100 angstroms. It is difficult and costly to produce satisfactory oxide coatings that are so thin.

U.S. Ser. No. 915,390 Lee proposes making both the floating gate and the control gate of polycrystalline silicon, hereinafter referred to as polysilicon. In such instance, oxide thickness under the floating gate need not be below about 100 angstroms. It can be 1000 angstroms. Moreover, the floating gate can be both charged and discharged merely by reversing polarity of a 20–40 volt potential applied between the control gate and the IGFET channel. Hence, it is easier to manufacture and easier to operate. On the other hand, the charge/discharge polarity reversal required individual IGFET isolation in a memory matrix. Individual IGFETs could be disposed in their own PN junction isolated pocket. However, this required extra masking and processing steps, and attendant yield losses, to produce the isolation.

The U.S. Ser. No. 915,390 type of device thus offers manufacturing advantages and disadvantages. I have found how to obtain the advantages without the disadvantages. I have found how to modify such a device to eliminate polarity reversal on the IGFET, and thereby eliminate the need for device isolation. Hence, no additional masking and processing steps to produce the isolation are necessary.

OBJECTS AND SUMMARY OF THE INVENTION

It is, therefore, an object of this invention to provide a polysilicon floating gate nonvolatile memory in which information can be written and erased without reversing control gate polarity or requiring individual device isolation.

Another object of this invention is to provide a unique method for storing and removing information from a polysilicon floating gate nonvolatile memory.

The invention comprehends an IGFET having a polysilicon floating gate and control gate over the IGFET channel that is paired with an adjacent memory control region having its own polysilicon floating gate and control gate. The memory control region is of the same conductivity type as the IGFET source and drain region and the floating gates are in low resistance electrical contact with each other. The floating gates are given a nonvolatile charge by applying a voltage to the IGFET control gate and the memory control region, while maintaining the source region and memory control region upper gate at zero potential. That charge is removed by reapplying the same potentials as mentioned above on the control gate. However, the potential on the memory control region is reduced to zero.

BRIEF DESCRIPTION OF THE DRAWING

Other objects, features and advantages of this invention will become more apparent from the following description of preferred embodiments thereof and from the drawing, in which.

DESCRIPTION OF THE PREFERRED EMBODIMENTS

Figure 1:
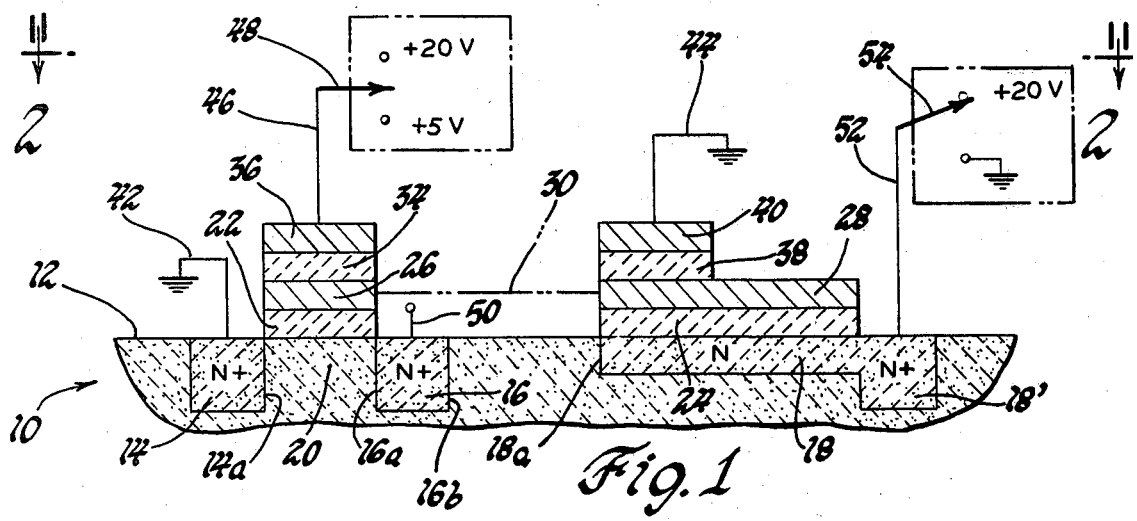
FIG. 1 shows a partially cross-sectional and diagrammatic fragmentary of one IGFET-memory control region pair in a semiconductor memory matrix made in accordance with this invention. For clarity, background lines and field oxide are omitted. The view is taken along the line 1—1 of FIG. 2.
Figure 2:
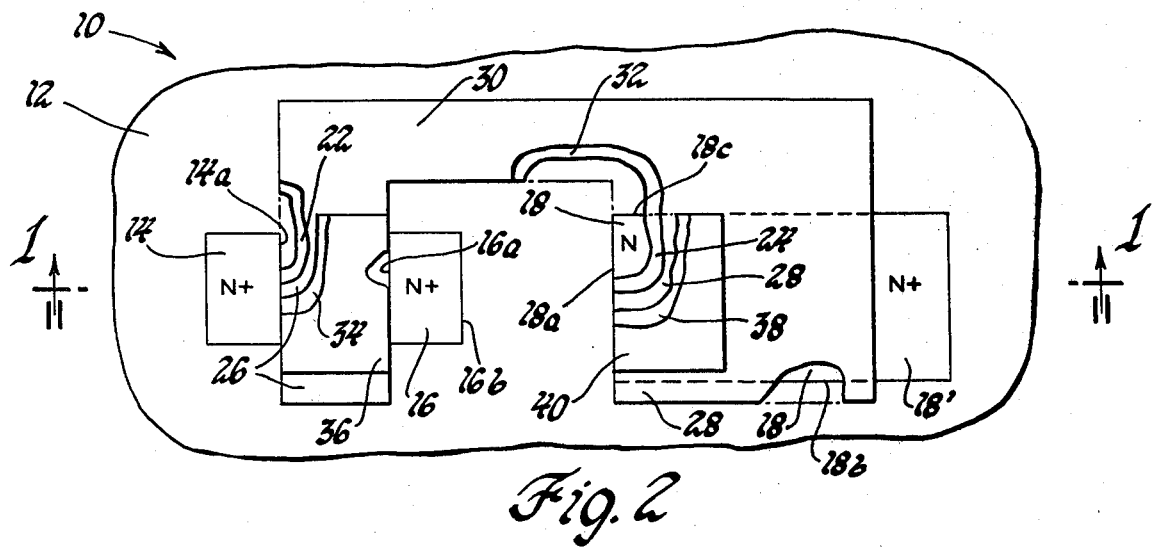
FIG. 2 is a plan view with parts broken away of the matrix site shown in FIG. 1, taken along the line 2—2 of FIG. 1.

Reference is now made to FIGS. 1 and 2 of the drawing, which represents but one fragment of a memory matrix integrated circuit on a chip 10 of single crystal silicon. The memory matrix shown is formed of a repetitive pattern of IGFET-memory control region pairs arranged in rows and columns. Ordinarily a memory matrix is associated on a chip with input and output devices, control circuitry, etc. Such devices and circuitry would also be used on the chip when the matrix is formed in accordance with this invention. In addition, a special switching circuit is used to this invention. It is schematically shown in FIG. 1 and is representative of all ancillary circuitry that would accompany the matrix on the chip. In order to focus attention on this invention better, additional ancillary circuitry on the chip is not shown. For similar reasons background lines and a field oxide is omitted in FIG. 1, as well as all mesa conformations. However, it should be recognized that such IGFET memory control region pair of this invention could be formed on a chip mesa, as for example as described in U.S. Pat. No. 3,751,722 Richman.

Silicon chip 10 is of 18 ohms-centimeter P-type single crystal silicon. However, 5–20 ohm-centimeter resistivity could be typically used. The upper surface 12 of chip 10 has three spaced island-like N-type rectangular regions 14, 16 and 18 embedded therein. Regions 14 and 16 are spaced a customary IGFET distance apart, as for example about 4–10, preferably 6, microns. N-type regions 14 and 16, respectively, serve as IGFET source and drain regions. The portion 20 of chip 10 between source and drain regions 14 and 16 serves as an IGFET channel. A gate oxide 22 covers IGFET channel 20. A similar gate oxide 24 covers memory control region 18. The gate oxides 22 and 24 are both thermally grown silicon dioxide and of a thickness of at least 50 angstroms, preferably of about 500–1200 angstroms in thickness. They are simultaneously grown in the normal and accepted manner on silicon surface 12, to be both pure and free of pin holes. A rectangular first polysilicon, i.e. polycrystalline silicon, floating gate 26 overlies oxide 22 and completely covers channel 20. A rectangular second polysilicon floating gate 28 overlies gate oxide 24 and covers most of memory control region 18. Polysilicon floating gates 26 and 28 are in low resistance electrical communication with one another, as indicated by the dotted line 30 in FIG. 1. The low resistance connection can be by an integral polysilicon extension of floating gates 26 and 28. Such an extension is designated by reference numeral 30 in FIG. 2 and corresponds to the dotted line 30 in FIG. 1. The combination of extension 30, gate 26 and gate 28 provides a continuous polysilicon layer. The field oxide 32 supports floating gate extension 30 to insulate it from surface 12 of chip 10. Thus, oxide extension 32, gate oxide 20 and gate oxide 22 comprise a continuous coating beneath the floating gates 26 and 28 and connecting link 30.

A rectangular area on the upper surface of polysilicon floating gate 26 covering channel 20 has an upper gate oxide 34 thereon. A rectangular polysilicon control gate 36 is disposed on the upper gate oxide 34, and is coterminous therewith. Analogously the upper surface of floating gate 28 has a rectangular gate oxide 38 thereon, and a rectangular polysilicon control gate 40 covering the gate oxide 38. Control gate 40 and gate oxide 38 are coterminous.

The upper gate oxides 34 and 38 can be of a thickness similar to that for the lower gate oxides 22 and 24, for example as low as 50 angstroms but preferably about 500–1200 angstroms. A thickness of about 500–600 angstroms is most preferred, for easing fabrication without significantly increasing voltages needed on the control electrode 36. The polysilicon thickness for all of gates 26, 28, 36 and 40 is not critical and can be the same for all gates. The thickness of lower oxide 22 under floating gate 26 should be low enought to allow a threshold voltage on channel 20 of less than about 5 volts. If necessary ion implantation can be used to adjust channel threshold voltage as needed.

Both the floating gates 26 and 28 and the control gates 36 and 40 are doped with arsenic or phosphorus to N+ type conductivity of about 0.005–25 ohm-centimeter resistivity. Thickness of the polysilicon gates is not critical. They can be thick or thin and are not necessarily all of the same thickness. By way of example, a convenient thickness is 0.4 micrometer. As seen in FIG. 2, N-type regions 14 and 16 are both rectangular in plan view and have a length of 14 microns and a width of 16 microns. N-type memory control region 18 is also rectangular in plan view and has a length of 48 microns and a width of 22 microns. Corresponding sides of all three regions are parallel. Side 14a of region 14 is spaced about 4–15 microns from the adjacent side 16a of region 16, to produce the IGFET channel 20. Customary IGFET source and drain spacing can be used in this invention. A similar spacing is preferably used between side 16b of region 16 and side 18a of N-type region 18, but it could be wider. The opposite sides 18b and 18c of memory control region 18 are over twice as long as its shorter sides, to provide a surface area for region 18 that is over four times greater than that of region 14 or region 16.

Source region 14 is electrically grounded through lead 42. Control gate 40 over memory control region 18 is also electrically grounded, through lead 44. Control gate 36 over IGFET channel 20 is alternatively connected to a source of +20 volts or +5 volts through connecting lead 46 and switch 48. Drain region 16 is connected through lead 50 to appropriate output devices on the chip (not shown) including current limiting resistors and the like. About 3–6 volts positive potential would ordinarily be applied to drain 16 through lead 50 when "reading" what charge is stored on the gates 26 and 28. However, when charging or discharging the floating gates, no voltage is applied to region 16. Its voltage during a write/erase cycle is thus zero. Memory control region 18 is alternatively connected to a source of 20 volts positive potential or to ground through connecting lead 52 and switch 54.

With both of switches 48 and 54 connected to the 20 volt source, the potential on the IGFET control gate 36 and on the memory control region 18 is 20 volts. However, source region 14 and control gate 40 are at zero potential, since they are grounded. It appears that the foregoing potentials cause electrons to flow from control gate 40 into floating gate 28, and from these also into floating gate 26 via integral connecting link 30. Once on the floating gates, the electrons remain substantially permanently, unless subjected to a suitable neutralizing influence. Hence, the charge they represent is nonvolatile. In such instance, the potential on the IGFET control gate 36 and the memory control region 18 can be removed, i.e. reduced to zero. The charge of floating gates 26 and 28 remains. A full charge on IGFET floating gate 26 significantly alters electrical conduction in channel 20. It raises the threshold voltage channel 20 from less than about 5 volts to some level about 5 volts. Thus, the conductivity condition or level of channel 20 has been significantly changed. IGFET control gate switch 48 can then be moved to the 5 volt position to supply a "read" voltage to channel 20. However, because the threshold voltage of the channel 20 has been changed to a level about 5 volts, there will be no source-drain conduction. This lack of conduction can be used to denite a zero in the memory matrix.

To remove the negative charge and reduce the channel threshold voltage below 5 volts, IGFET switch 48 is returned to the 20 volt position. However, the memory control region switch 54 is moved to the grounded position. Hence, the memory control region 18 becomes grounded along with the source region 14 and the memory control region control gate 40. It appears that this causes an electron flow from IGFET floating gate 26 to IGFET control gate 36. In any event, threshold voltage of channel 20 is reduced to below 5 volts. This reduction in threshold voltage is not dependent upon continued application of 20 volts on IGFET control gate 36. The effect is thus non-volatile. IGFET switch 48 can thus be moved to the 5 volt position for applying the IGFET "read" voltage. Because threshold voltage of channel 20 is below 5 volts, source-drain conduction will occur. The resulting conduction can be used to denote a "one" in a memory matrix.

If the latter application of voltage is continued long enough, it also appears that the floating gates can even become positively charged, analogous to the device in the aforementioned U.S. Ser. No. 915,390 Lee. In general, speed of electron transfer, i.e. programming speed, would thus be dependent on oxide thickness, voltage, etc. Highest speed should be attained with combined gate oxide thicknesses of 2400 angstroms or less. Programming voltages as low as about 20-40 volts are preferred but higher and lower voltages can be used. In general, the higher the programming voltage, the faster the speed of electron transfer. Accordingly, one can use any given programming voltage that will cause the floating gates to acquire or lose a given charge in a given time period. In substance, any voltage is appropriate if it is sufficiently higher than the "read" voltage to avoid any confusion and causes fast enough switching for the circuitry involved. If a difference of only 5 volts from the "read" voltage is enough to produce such an effect, that voltage difference is significant enough for use in programming in accordance with this invention. In the latter connection, I wish to also mention that this invention can also be used on enhancement p-channel devices, where a significantly higher negative voltage would be used to program and reprogram, rather than a significantly larger positive voltage. Analogously, this invention can be used in connection with depletion type p-channel and n-channel IGFETs.

Figure 3:
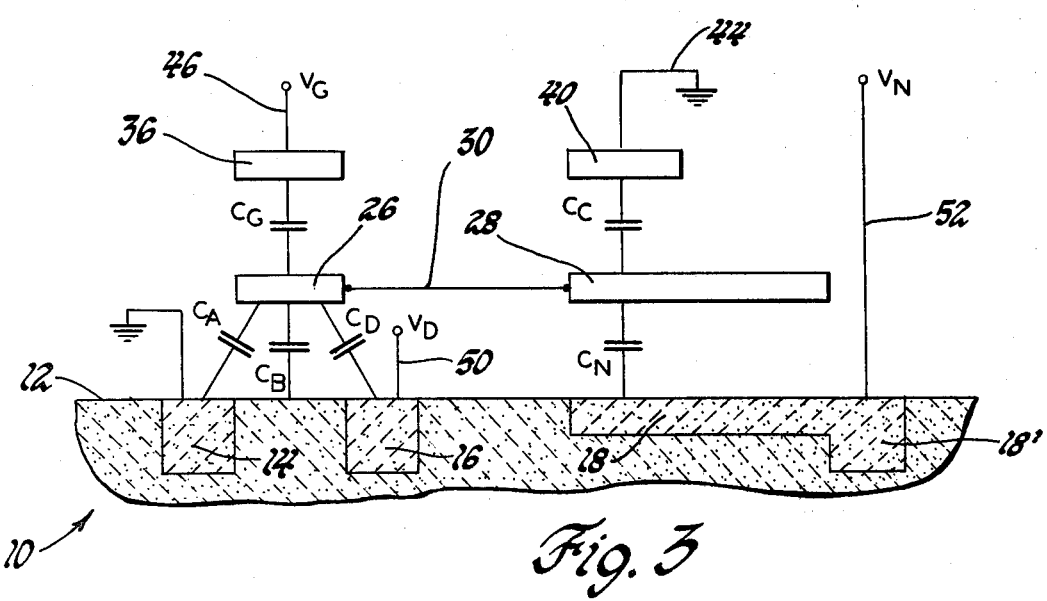
FIG. 3 schematically illustrates the capacitances involved in the structure shown in FIGS. 1 and 2.

I believe that my memory control region 18 and overlying floating gate and my floating gate short produces a unique capacitance coupling. I believe the capacitive coupling produces a sufficient potential difference between the floating gates and the two control electrodes to get a significant electron flow to and from the floating gates. I believe that the electron flow to and from the floating gates is produced by inducing a significant difference between the floating gates and IGFET control gate 36 or memory control region control gate 40 in accordance with the following relationship:

$$V_{FG} = \frac{V_G C_G + V_N C_N + V_D C_D - Q}{C_S + C_B + C_D + C_G + C_C + C_N}$$

where Q is the charge on the floating gate, and the voltages and capacitances are as identified in FIG. 3. The reference numbers in FIG. 3 refere to the elements therein corresponding to elements shown in FIGS. 1 and 2. The relative areas of channel 20, N-type region 18 and the control gates are chosen to produce a capacitance relationship in which $C_B=1$, $C_G=C_C=2$, $C_N=8$, and $C_S=C_D\approx 0$ in normalized units. Since Q is small compared to $V_G C_G$ and $V_N C_N$, one can treat Q as equal to zero. Also, $V_D$ is equal to zero during charging or discharging a write/erase cycle. When both $V_G$ and $V_N$ equal a positive 20 volts. the voltage level of floating gates 26 and 28 would be as follows:

$$\frac{(20)(2) + (20)(8)}{13} = +15.4 \text{ volts.}$$

During erase, $V_G = +20$ volts but $V_N$ is equal to zero. In such instance the voltage on the floating gates is as follows:

$$\frac{(20)(2)}{13} = +3.1 \text{ volts.}$$

With a floating gate potential of 15.4 volts, electrons are attracted to the memory control region floating gate 28 from control gate 40 through the thermal oxide of $C_C$. Such action also negatively charges floating gate 26, through connecting link 30. When erasing, the initial potential difference between the IGFET control gate 36 and the floating gates is 16.9 volts. Electrons are thus attracted to the IGFET control gate 36 from floating gate 26 through the thermal oxide of $C_G$.

From the above, one would want $C_N$ to have the highest capacitance. If dielectric thickness, composition, etc., of all the capacitors is about the same, the chief adjustment in capacitance is by area adjustment of the capacitor plates. In such instance, N-type region 18 and polysilicon floating gate 28 would have areas as large as is practical, compared to the areas of floating gate 26 and control gate 36. The latter area, as a practical matter, would normally be as small as will still permit contacts to be reliably made, and by the charging and discharging, i.e. programming, speed, that is desired. In substance, the smaller the area of control gate 36, or of floating gate 26, the slower the speed of reprogramming. To attain best results $C_N$ should be at least double, and preferably at least quadruple, $C_G$. Obviously, the source and drain regions should be made as small as is practical. Ordinarily the IGFET control gate 36 would be larger than the floating gate, since contacts would have to be made to it. Hence, floating gate 26 is more relevant to establishing initial floating gate potential than IGFET control gate 36. Assuming a general register of floating gate 28 over memory control region 18, the area of floating gate 28 would normally be smaller than that of memory control region 18, to which electrical contact must be made. Thus, in general, I would prefer the area of floating gate 28 above region 18 to be about four times larger than the area of floating gate 26 beneath control gate 36. Analogously, control gate 36 should not have an area over floating gate 26 that is appreciably greater than the area of control gate 40 over floating gate 28, and preferably less.

My memory device can be made by self-aligned silicon gate techniques analogous to those disclosed in U.S. Pat. No. 3,475,234 Kerwin et al, after a selective N-type ion implantation into surface 12 of chip 10 to produce the shallower N-type region 18. However, this ion implantation can be done during the same ion implantation normally given integrated circuit IGFET memories for producing depletion type IGFETs. Hence, no extra processing steps are required for device isolation and gate oxides are sufficiently thick to be readily formed. Also, the major portion of N-type region 18 is formed first by ion implantation. It is thus shown to be shallower and of lighter doping than regions 14 and 16. It has a deeper portion 18' not covered by the floating gate 28 that is shown of the same depth as the source region 14 and drain region 16. Portion 18' is shown as deeper and of N+ conductivity because it is formed during the same diffusion that forms regions 14 and 16. Portion 18' provides a lower contact resistance for lead 52 than the more lightly doped ion implanted portion 18.

The embodiments of the invention in which an exclusive property or privilege is claimed are defined as follows:

1. An electrically erasable IGFET nonvolatile memory comprising:
   a semiconductive material surface zone of one conductivity type;
   at least three opposite conductivity-type regions in said zone, two of which respectively serve as source and drain regions of an IGFET and the third serves as a memory control region for that IGFET;
   two polysilicon gate electrodes respectively insulatingly spaced above an IGFET channel between the source and drain regions and above the memory control region and in low resistance electrical connection only with each other;
   two polysilicon control gate electrodes respectively insulatingly spaced above said floating gate electrodes;
   means for applying an appropriate electrical potential simultaneously to both the channel control electrode and to said memory control region while maintaining said source region and other control electrode at a relative zero potential, to store a nonvolatile charge on said floating gates for switching the IGFET channel from one conductivity condition to another; and
   means for changing the potential on the memory control region to that of the source region and other control electrode, so that application of said appropriate potential to said channel control electrode removes the nonvolatile charge on said floating gates and allows said IGFET channel to switch back to its initial conductivity condition.

2. An IGFET nonvolatile memory circuit comprising:
   a semiconductive surface zone predominantly of one conductivity-type;
   at least three opposite conductivity-type regions in said zone, two of which respectively provide an IGFET channel therebetween and the third of which provides a memory control region for the IGFET and is substantially larger in area than the IGFET channel;
   two electrically floating but integrally interconnected polysilicon gate electrodes insulatingly spaced respectively above the IGFET channel and the memory control region, and having respective areas in a ratio of less than about one-half;
   tow discrete electrically active polysilicon gate electrodes insulatingly spaced respectively above the floating gate electrodes, and having a respective capacitance therewith in a ratio that is not appreciably more than about 1:1;
   means for maintaining the active gate electrode over the IGFET channel at a potential of at least about 10 volts;
   means for concurrently maintaining the IGFET source region and the memory control region active gate electrode at a relatively zero potential; and
   means for alternatively maintaining same memory control region at a potential similar to the channel active gate electrode or to relative zero potential, whereby a single electrical potential applied to the channel active gate electrode can alternatively cause a given electrical charge to accumulate on and be removed from the floating gates and thereby significantly alter conductivity of said IGFET channel without reversing polarity of potential applied to said zone.

3. An IGFET nonvolatile memory unit comprising:
   a semiconductive material surface zone of one conductivity-type;
   at least three N-type regions in said zone, two of which respectively serve as source and drain regions for an IGFET and have a combined area less than the third;
   two polysilicon gate electrodes respectively insulatingly spaced above an IGFET channel between the source and drain regions and above the memory control region and having a respective relative capacitance with said channel and said region in a ratio of less than about one-half, said electrodes in low resistance electrical contact only with each other;
   two polysilicon control gate electrodes respectively insulatingly spaced above said first-mentioned electrodes and having a respective relative capacitance therewith in a ratio generally equal or less;
   means for simultaneously applying a positive electrical potential greater than about 15 volts to both the channel control gate electrode and to said third N-type region with respect to each of said source region and said other control gate electrode to reverse bias the N-type region with respect to said zone and said channel control electrode and cause electrical charge to be nonvolatilely stored on said floating gates and thereby produce a change in IGFET channel conductivity surviving removal of said potential; and
   means for switching the N-type region to ground, along with the source region and other gate electrode so that further application of said positive potential to the channel control electrode removes the aforesaid electrical charge stored on said floating gates and produces a second channel conductivity surviving removal of said potential.

4. An integrated circuit having an electrically erasable IGFET nonvolatile programmable memory matrix comprising:
   at least three N-type regions on a P-type silicon surface at each of a plurality of sites in a memory matrix, two of said regions serving as an IGFET source and drain and defining ends of an IGFET channel therebetween, the third region serving as a memory control region for that IGFET;
   an electrically floating polysilicon gate electrode insulatingly spaced above each of the IGFET channel and memory control regions by a mutually similar thickness of thermally grown silicon oxide and having a respective relative capacitance thereof of less than about 1:2, said floating gate electrodes being integrally interconnected;
   a separate polysilicon control gate electrode insulatingly spaced above each of said floating gate electrodes by a mutually similar thickness of thermally grown silicon oxide and having a generally equal respective capacitance therewith;
   means for applying a positive potential of about 15–30 volts to both the channel control electrode and to said memory control region with respect to each of said source region and said other control electrode to induce a nonvolatile negative electrical charge on said floating gates with sufficient field effect to block IGFET channel connection below a predetermined channel control gate voltage less than about 10 volts; and means for removing the positive potential on the memory control region and reducing it to the same potential as said source region and other control electrode to remove the nonvolatile negative electrical charge on said floating gates and allow said IGFET channel to be conductive below said predetermined channel control gate voltage.

5. A method of electrically both storing a nonvolatile charge and removing it from a polysilicon floating gate IGFET on a semiconductive surface without reversing polarity of potentials applied to the IGFET polysilicon control gate comprising:

providing a memory control region in said surface of conductivity type similar to the IGFET source and drain;

simultaneously forming a polysilicon floating gate and control gate over said region when forming the IGFET polysilicon floating and control gates, with the region and its floating gate each being at least twice the area of the IGFET floating gate and the region control gate area not being appreciably larger than that of the smaller of the IGFET floating and control gates, said floating gates having a low resistance electrical connection;

storing a nonvolatile charge on both floating gates by applying a significant electrical potential to the IGFET control gate and to said memory control region while maintaining the source region and other control gate substantially at zero relative potential; and removing said nonvolatile charge from both floating gates by applying a significant electrical potential to the IGFET control gate similar to that applied above while maintaining the memory control region, its control gate and the source region substantially at zero relative potential.

6. A method of electrically writing and erasing information in an n-channel polysilicon floating gate IGFET programmable memory matrix without reversing potentials on IGFETs in the matrix or requiring individual isolation of IGFETs in the matrix comprising:

providing a plurality of N-type regions on a silicon surface with one region adjacent each memory matrix site where an IGFET is to be formed, each N-type region being larger in area than the channel of the IGFETs to be formed adjacent the region;

providing a polysilicon floating gate over each N-type region and IGFET channel at each matrix site, with such gates of each site being integrally connected;

at each matrix site providing N-type source and drain areas for said channel and discrete polysilicon active gate electrodes over each N-type region and channel;

applying at least about 10 volts positive potential to the channel active electrode and to said N-type region at a first group of selected matrix sites while grounding the other active gate electrode and the IGFET source at said sites to raise IGFET threshold voltage at said selected sites above a predetermined value, said raise remaining after said potential is no longer applied;

applying at least 10 volts positive potential to only the IGFET active gate electrode at one or more of said selected matrix sites while grounding not only the IGFET source and other active gate electrode but also the N-type region at said one or more sites, to reduce IGFET threshold voltage at said one or more sites below a value that reduction remaining after said potential is no longer applied.

* * * * *